United States Patent [19]

Riglet et al.

[11] Patent Number: 4,904,607
[45] Date of Patent: Feb. 27, 1990

[54] METHOD OF MANUFACTURING AN INTEGRATED INFRARED DETECTOR

[75] Inventors: Philippe P. Riglet, Limeil-Brevannes; Jean-Paul R. Chané, Yerres, both of France

[73] Assignee: U.S. Philips Corp., New York, N.Y.

[21] Appl. No.: 271,569

[22] Filed: Nov. 15, 1988

[30] Foreign Application Priority Data

Nov. 20, 1987 [FR] France ................ 87 16090

[51] Int. Cl.$^4$ ............................. H01L 27/14
[52] U.S. Cl. ............................. 437/3; 437/5;
  437/27; 437/90; 148/DIG. 80; 357/30; 357/16; 357/41
[58] Field of Search ........... 437/3, 5, 47, 51, 90, 437/91; 148/DIG. 80; 359/22 A, 22 B, 22 F, 30 I, 30 G, 30 E, 30 B

[56] References Cited

U.S. PATENT DOCUMENTS

| 4,314,858 | 2/1982 | Tomasetta et al. | 437/48 |
| 4,745,446 | 5/1988 | Cheng et al. | 357/30 |
| 4,771,325 | 9/1988 | Cheng et al. | 357/30 |

FOREIGN PATENT DOCUMENTS

| 0049485 | 3/1986 | Japan | 437/90 |
| 0171176 | 8/1986 | Japan | 437/5 |
| 0247563 | 10/1987 | Japan | 437/51 |
| 2168527 | 6/1986 | United Kingdom. | |
| 2168528 | 6/1986 | United Kingdom. | |

Primary Examiner—Brian E. Hearn
Assistant Examiner—Tuan Nguyen
Attorney, Agent, or Firm—William L. Botjer

[57] ABSTRACT

A method of forming an integrated circuit for the detection of infrared radiation comprising a semi-isolating substrate provided with a buried PIN photodiode, with a junction field effect transistor J-FET, whose gate is connected to the PIN photodiode, and with a resistor R connected to the transistor, this method including the growth of a first structure of epitaxial layers of semiconductor materials, in which the J-FET transistor is formed, the growth of a second structure of epitaxial layers of semiconductor materials, in which the PIN diode is formed, and the step of etching a pit, in which the second structure of layers is formed, characterized in that the step of etching the pit is effected after the growth of the first structure of epitaxial layers and is carried out through this structure down to the substrate, in that the growth of the second structure of epitaxial layers is localized in such a manner that this second structure is limited to the pit and in that its upper surface is copolanar with that of the first structure of layers.

26 Claims, 7 Drawing Sheets

METHOD OF MANUFACTURING AN INTEGRATED INFRARED DETECTOR

BACKGROUND OF THE INVENTION

The invention relates to a method of manufacturing an integrated circuit for detecting infrared radiation comprising a semi-isolating substrate provided with a buried PIN photodiode, with a junction field effect transistor J-FET, whose gate is connected to the PIN photodiode and with a resistor R connected to the transistor, this method including the step of growing a first structure of epitaxial layers of semiconductor materials, in which the transistor of the J-FET type is formed, the step of growing a second structure of epitaxial layers of semiconductor materials, in which the PIN diode is formed, and the step of etching a pit in which the second structure of layers is formed.

The invention is used in the manufacture of infrared detectors, especially for use at the wavelengths 1.3 and 1.55 μm in the field of telecommunication. The device according to the invention may be coupled, for example, to optical guides.

A manufacturing method for obtaining an integrated photodetector comprising a PIN photodiode, a field effect transistor of the J-FET type and a resistor is known from British Patent Application 2,168,528. According to this method, a pit is first formed by etching in a substrate of semi-isolating InP to receive the layers that will form the photodiode. These layers comprise a buffer layer of the $n^+$ type, which also serves as n contact for the diode and is formed either by ion implantation or by LPE; and a buried epitaxial layer of GaInAs of the $n^-$ type formed by LPE, which fills the pit and flows out of the pit and extends flatly on the surrounding region. This method then comprises the step of etching this planar layer of GaInAs of the $n^-$ type until the upper part of the pit filled with this material surrounded by the substrate of InP is exposed; the epitaxial growth by LPE of GaInAs of the n-type or of GaInAsP of the n-type on the whole surface of the device to form the channel region of the J-FET; the epitaxial growth by LPE of GaInAs of the p-type or of InP of the p-type to form the gate of the J-FET; the local diffusion of zinc atoms to form the p-type region of the diode and the interconnection of the diode, the gate of the J-FET and the resistor to be formed. This method finally comprises etching steps to isolate the elements, except in the connection regions, and of depositing layers to form the resistor and the electrical contacts. Especially, the n contact of the diode is formed by exposing the layer of $n^+$-type InP during the manufacture of a MESA around the diode. The illumination of this diode is effected through the back surface of the substrate.

Now it appears that, in order to form during the same process a transistor of the J-FET type and a PIN diode, it is necessary to accurately control both the thicknesses of the layers required for forming these elements and the dopings of these layers because these thicknesses and these dopings are different for each of the structures of layers constituting these elements.

According to the known method, especially the p-type layer forming the p-type region of the diode can only have a very substantial thickness due to the chosen mode of use. Such a large thickness leads to a low quantum efficiency, which is detrimental to the performances of the diode.

Moreover, according to the known method, the diode can only be formed from a simple hetero-structure, which does not lead to optimal performances.

Besides, according to the known method, each of the layers is formed by LPE with a given growth doping and more particularly for obtaining the transistor, a layer of p-type GaInAs or of p-type InP is formed by LPE at the surface of a layer of n-type GaInAs or of n-type GaInAs.

Now it is always difficult to form two layers of opposite conductivity types at the surfaces one of the other by the same technology because the species serving to dope the first layer pollute the reactor and therefore the second layer during its formation. It is also difficult to form two layers of the same conductivity type doped at different levels by the same technology because the transition is then not abrupt and the layers are poorly differentiated. Therefore, care should be taken not to form the layer of the $n^+$-type and the layer of the n-type of the diode by the same technology, as is stated in the aforementioned document.

Otherwise, the known method includes a step by means of which an etching treatment is carried out to expose a surface comprising two zones of different materials: a first zone of $n^-$-type GaInAs corresponding to the n-type region of the diode in the pit and a second zone surrounding the first zone and constituted by the material of the substrate of InP. Such an etching treatment can be effected only with great difficulty if a flat surface should be obtained because etching of different materials, such as GaInAs and InP, takes place with great different rates. Such a step must therefore absolutely be avoided.

It should further be noted that the known device can be illuminated only through the back surface of the substrate, which is a disadvantage in all the cases in which the photodetector device is not a discrete component, but is incorporated in an integrated circuit. In the latter case, a device must be provided which can be illuminated through the upper surface of the substrate.

The present invention proposes a method of manufacturing a photodetector device which permits of avoiding these different disadvantages and which can moreover be operated in a simple manner.

SUMMARY OF THE INVENTION

According to the invention, these objects are achieved by means of the method defined in the preamble and moreover characterized in that the step of etching the pit is carried out after the growth of the first structure of epitaxial layers and is effected through this structure into the substrate, in that the growth of the second structure of epitaxial layers is localized in such a manner that this second structure is limited to the pit and in that its upper surface is coplanar with that of the first structure of layers.

In these conditions and in the conditions in which especially the method according to the invention is carried out, which are the subject matter of the appended claims, this method has inter alia the following advantages:

the thickness of the device is smaller than that of the known device due to the fact that the layers of the transistor have already been formed when the step of etching the pit for receiving the diode structure is carried out;

the thickness, the composition and the doping concentration of the layers are controlled more accurately due to the fact that the doping is effected independently of the growth of the layers, which is effected at the residual doping concentration. Thus, the p-type layer of the diode has a small thickness and the quantum efficiency therefore is improved. On the other hand, a diode formed from a single or a double hetero-structure can be realized at will due to the fact that the formation of the stack of layers of the diode is obtained independently of the formation of the transistor. Thus, a diode can be obtained having optimal performances. All the layers can have an optimized doping level and an optimized thickness. Moreover, the practice of implantation annealing in the chamber of the reactor used for the subsequent formation of the epitaxial layers permits of obtaining a simplification of the prcedure, a saving in time and the option of carrying out this annealing in a controlled atmosphere, which avoids the deterioration of the surface;

the provision of an etch stopper layer during the formation of the stack of the diode layers in the pit permits of opening a window to form the n+ diode contact without damaging this contact layer.

BRIEF DESCRIPTION OF THE DRAWINGS

The invention will be understood more clearly by means of the following description illustrated by the accompanying Figures, of which.

DETAILED DESCRIPTION OF THE PREFERRED EMBODIMENT

Figure 1A:
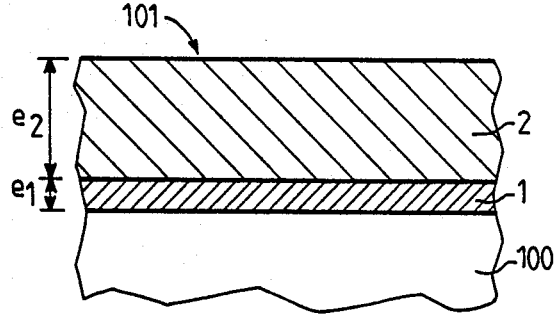
FIGS. 1a to 1k show in sectional view the different steps of the method of manufacturing the photodiode and the transistor of the J-FET type.
Figure 4:
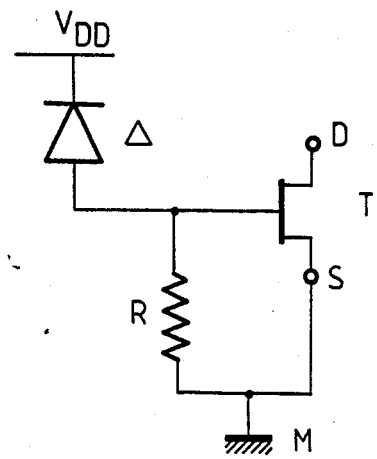
FIG. 4 shows diagrammatically the electric circuit formed by the elements of the integrated circuit according to the invention.

As shown diagrammatically in FIG. 4, the photodetector device according to the invention comprises a PIN photodiode Δ, the n-type contact of which is connected to a D.C. supply line $V_{DD}$ and the p-type contact of which is connected to the gate of a transistor T of the J-FET type. The gate of this transistor T is therefore a p-type contact and the source and drain S and D are n-type contacts. The source S is connected to an earth line M and the detected signal is available at the drain D. A load resistor R of the transistor is disposed between the gate and earth. According to the application of the device, the voltage $V_{DD}$ will be of the order of 10 V and the load resistor R can be chosen between 50Ω and 100 kΩ.

The method according to the invention permits of obtaining simultaneously the photodiode, the transistor of the J-FET type and the load resistor as well as the input and output connections.

It should be noted that this simultaneous formation meets three main problems due to the difference in structure of these components:

a difference in thickness, i.e. in their dimensions perpendicular to the substrate; and thickness of the PIN photodiode intended to detect the signals having a wavelength of 1.3 or 1.55 μm and consisting of $Ga_{0.47}In_{0.53}As/InP$ is of the order of 5 to 5.5 μm. On the other hand, the transistor has a thickness which does not exceed 1 μm;

a difference of doping of the active layers; the active layer of the n+ type in the transistor must have a doping of the order of $10^{17}.cm^{-3}$, while the active layer of the n− type in the photodiode must have a doping of the order of $10^{15}.cm^{-3}$;

accurately localized doping zones; in fact a layer of the n++ conductivity type must be provided under the active layer of the photodiode in order that the n-type contact can be formed. This n++ type layer must be fully separated from the n− type layer covering it.

In fact, in the method known from the prior art of manufacturing the photodiode, a layer of InP of the n+ type is also formed under the layer of InP of the n− type on the bottom of the pit. However, in the aforementioned document, it is stated that these layers can be formed in the same reactor by the same epitaxy method one after the other. Now, it has appeared that it was very difficult to control the passage from the n+ doping to the subsequent n− doping due to the pollutions of the reactor. This method must therefore be dissuaded.

Therefore, according to the invention, these layers will be formed by different methods.

As shown in FIGS. 1a to 1k representing diagrammatic sectional views of the device, of which especially the thickness dimensions are very disproportionate with respect to the width or length dimensions for the sake of clarity of the drawing, the method according to the invention comprises the following steps:

(a) forming a substrate 100 of monocrystalline indium phosphide (InP) having an orientated and semi-isolating flat surface. The block has been obtained, for example, by drawing by means of the Czochralski method with liquid encapsulation along the cyrstallographic [001] axis and cut into lammellae having surfaces disorientated by 3° with respect to the crystallographic (001) plane to ensure a better restarting of the epitaxy, the disorientation being parallel to the [110] direction. The single crystal is obtained in the semi-isolating state by doping with chromium (Cr) (see FIG. 1a).

(b) Forming on the whole surface of the substrate 100 a layer 1 of not intentionally doped indium phosphide (InP). The method used may in this case be either an organo-metallic epitaxial growth from the vapour phase (MOVPE) or a chloride epitaxial growth from the vapour phase. This layer 1 may be dispensed with, but it improves the quality of the next layer. It is a very small thickness. A favourable thickness will be, for example, $e_1 \leq 0.2$ μm (cf. FIG. 1a in sectional view).

(c) Forming on the whole surface of the substrate 100 by the same method as above a layer of not intentionally doped gallium indium arsenide ($Ga_{0.47}In_{0.53}As$). A favourable thickness will be, for example, $e_2$, such as 0.5 μm $\leq e_2 \leq$ 1 μm.

(d) Ion implantation on the whole surface of the layer 2 of gallium indium arsenide to form a layer 3 of n-conductivity type. The layer 3 of n-type GaInAs is intended to form the active layer of the junction gate transistor (J-FET). This n-type ion implantation is effected by means of $Si^{28}$ ions at a concentration of the order of $10^{17}.cm^{-3}$ in the layer 2 of GaInAs. In order to form the active layer 3, the implantation depth of the Si ions will favourably be $e_3$, such as $0.4\ \mu m \leq e_3 \leq 0.9\ \mu m$. An implantation annealing treatment is effected in the epitaxy reactor at partial arsine (AsH$_3$) pressure at about 700° C. for about 15 min (cf. FIG. 1b in sectional view).

(e) Covering the whole device by means of a dielectric layer MK1 followed by a photoresist layer MK2. The dielectric layer MK1 may consist, for example, of silica (SiO$_2$) having a thickness of $eK \approx 0.15\ \mu m$. The layer of photoresist will on the contrary be very thick to protect the device during subsequent etching and ion implantation steps. For this purpose, the layer MK2 will favourably have a thickness $ek2 \approx 6\ \mu m$ (cf. FIG. 1c in sectional view).

(f) Forming in the layer MK2 of photoresist openings 50 at the future locations of the photodiodes the photolithography. These openings 50 have favourably square dimensions $A \times A$ with $A \approx 200\ \mu m$.

Figure 1B:
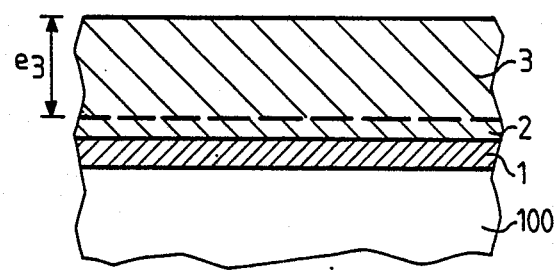
Figure 1C:
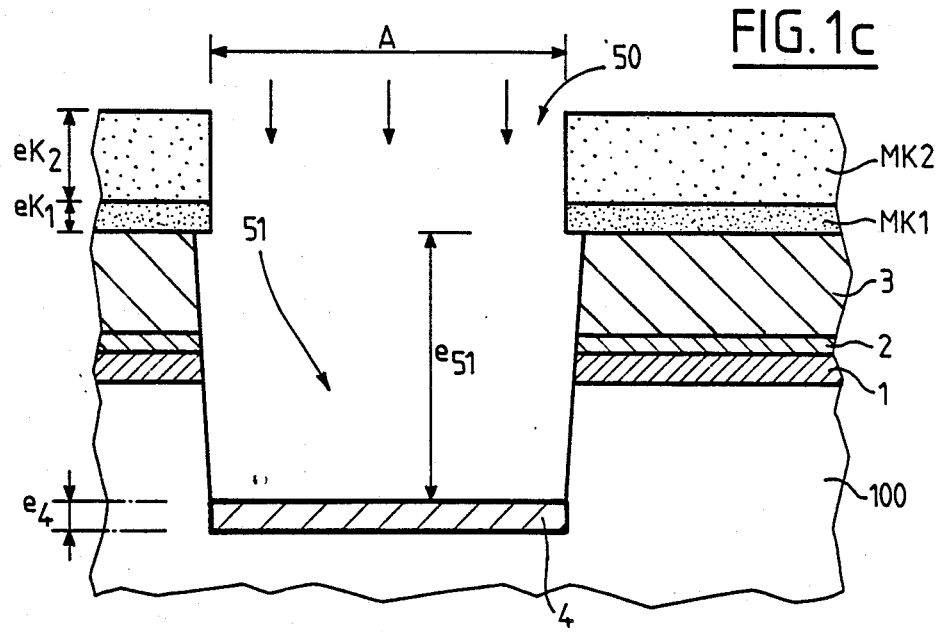

(g) Etching through the openings 50 successively the dielectric layer MK1, then the layer 3 of n-type GaInAs, the layer 2 of undoped GaInAs, the layer 1 of undoped InP and the substrate until a pit 51 is formed having a depth of $e_{51}$, such as $5\ \mu m \leq e_{51} \leq 5.5\ \mu m$ in the semiconductor materials (cf. FIG. 1c). The dielectric layer MK1 can be etched chemically, for example by means of diluted hydrofluoric acid. The layer 2 of GaInAs can be etched by means of a mixture of parts by volume of $4H_2SO_4 + 1H_2O_2 + 10H_2O$. The layer 1 and the substrate 100 of InP can be etched by means of the mixture of a normal solution of potassium bichromate (abbreviated: K), acetic acid (abbreviated: C), hydrobromic acid (abbreviated: B) in parts by volume of: 1 K + 1 B + 1 C. In certain crystallographic orientations, the etching flanks are then practically perpendicular to the planes of the layers. However, a very small "under-etching" appears under the layers MK1/MK2 along the openings 50 (cf. FIG. 1c).

However, if the opening 50 is provided in such a manner that it has at least one edge parallel to the crystallographic (110) plane, the etching flank along this edge is not perpendicular to the substrate, but descends with a gradual slope towards the bottom of the pit. This property can be utilized advnatageously in the subsequent steps for forming the n-type contact of the diode at the level of the upper surface of the device. This n-type contact can therefore be formed by means of two methods, as will be shown hereinafter.

(h) Localized ion implantation in the opening 50 to form in the bottom of the pit 51 a layer 4 of $n^{++}$ conductivity type. This layer can be formed, for example by implantation of Si$^{28}$ ions with a high energy of, for example, 700 keV to obtain an implantation depth $e_4 \approx 0.6\ \mu m$. Attempts are made to obtain a constant doping exceeding $10^{17}.cm^{-3}$ over a large depth because this layer is intended to receive the n-type ohmic contact of the photodiode $\Delta$. The $n^{++}$ conductivity permits of obtaining a small contact resistance between the ohmic contact and the photodiode. Moreover, the thickness $e_4$ formed permits of avoiding a sensitivity of this layer 4 to the slight re-etching occasionally occurring during the beginning of the epitaxial growth of the layer that will cover it in a subsequent step. The implanted layer 4 is subjected to an implantation annealing treatment in an epitaxy reactor at a temperature of the order of 700° C. for about 1 hour at a partial phosphine (PH$_3$) and arsenic (As$_2$) pressure. However, before this annealing treatment is effected, the layer MK2 of photoresist is eliminated.

In the case in which the pit 51 has one gradually slanting flank, the layer MK2 of photoresist is eliminated over a zone adjacent to this flank and the dielectric layer MK1 can be maintained in this region. The ion implantation is then effected in the opening thus formed in the layer MK2, as the case may be through MK1, and the result is a layer 4 of the $n^{++}$ conductivity type extending not only at the bottom of the pit, but also along the gradually slanting flank and along the adjacent edge. The implantation annealing treatment is then carried out as described above.

(h) Epitaxial growth localized by the mask MK1 in the pit 51 in the same epitaxy reactor at the surface of the implanted layer 4 of a layer 6' of gallium indium arsenide (GaInAs) having a thickness of about 0.1 $\mu m$. This layer is not absolutely necessary, but will permit in a subsequent step of stopping automatically the step of etching the layers at a desired level. It is not intentionally doped and has a residual doping of about $2.10^{15}.cm^{-3}$ (cf. FIG. 1d in sectional view). The sample is not removed from the reactor between the step (h) and the subsequent steps of epitaxial growth.

The choice of the type of technology for the epitaxial growth of the layers forming the photodiode in the pit 51 is in favour of the method of chloride epitaxy from the vapour phase. In fact there are other methods of epitaxial growth; for example, the so-called MBE method or method of molecular beam epitaxy, but nowadays the growth of the material InP is difficult when using this method; or, for example, the so-called LPE method or epitaxy from the liquid phase, but the thickness of the layers can be controlled only with difficulty by this method. On the contrary, the method of chloride epitaxy from the vapour phase (VPE) permits of obtaining layers of high purity and of accurately controlled thickness and permits of obtaining that the growth does not take place on the mask MK1 of dielectric material, of silica (SiO$_2$), which results in that spontaneously at the end of the thus localized formation of the different layers of the diode a practically planar device will be obtained. The etching treatment used in the method known from the prior art will therefore be superfluous. Only a slight swelling 52 of the order of 3 $\mu m$ appears to occur along the opening of the pit.

During this step (h') and the next step (i), the protective layer MK1 of dielectric material is maintained. All the epitaxial layers are formed one after the other and by means of the annealing in the step (h) in the same reactor.

Figure 1D:
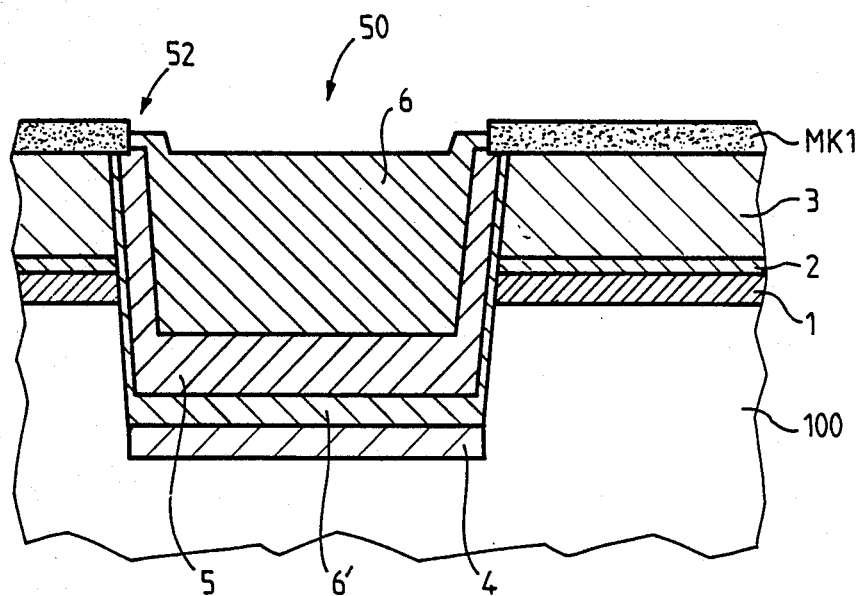

(i) Epitaxial growth by the same method at the surface of the layer 6' or 4 of a layer 5 of n-type indium phosphide (n-type InP) having a thickness of $e_5 \approx 2\ \mu m$ and then of a layer 6 of n-type gallium indium arsenide (Ga$_{0.47}$In$_{0.53}$As) having a thickness $e_6$, such as $3\ \mu m \leq e_6 \leq 3.5\ \mu m$, the thickness $e_6$ being about the difference between $e_{51}$ and $e_5$. These layers are not intentionally doped. The layer 5 of InP has a residual doping of the order of $10^{14}$ to $10^{15}.cm^{-3}$ and the layer 6 of GaInAs has a residual doping of the order of $2.10^{15}.cm^{-3}$ (cf. FIG. 1d in sectional view). At the end of this growth, the mask MK1 is eliminated (cf. FIG. 1e in sectional view). Thus, a hetero-structure InP/GaInAs as shown in FIG. 1d is thus obtained.

However, it is often desirable, in order to improve the performances of the diode, to obtain a double heterostructure InP/GaInAs/InP. According to the invention, this formation is facilitated. In this case, the layer 6 of gallium indium arsenide (GaInAs) of 2

$\mu m \leq e_6 \leq 2.5$ μm thickness followed by a layer 5' of indium phosphide (InP) of $e_5' \approx 1$ μm thickness also at its residual doping concentration. This variation is shown in FIG. 1e.

Figure 1E:
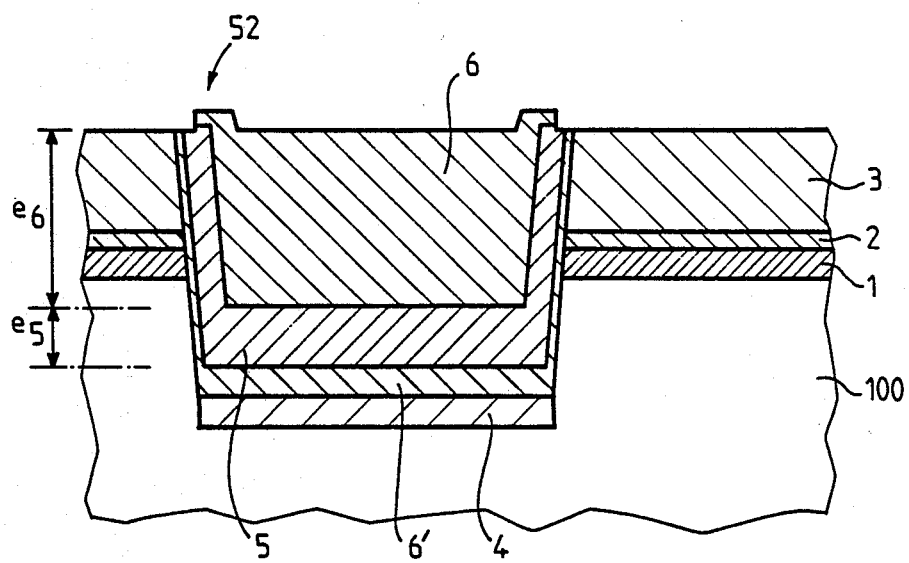
Figure 1F:
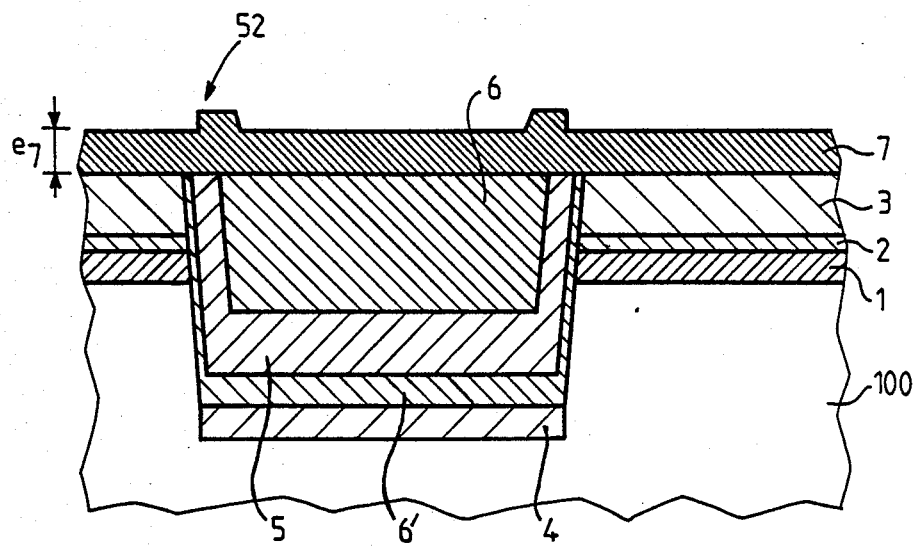
Figure 1G:
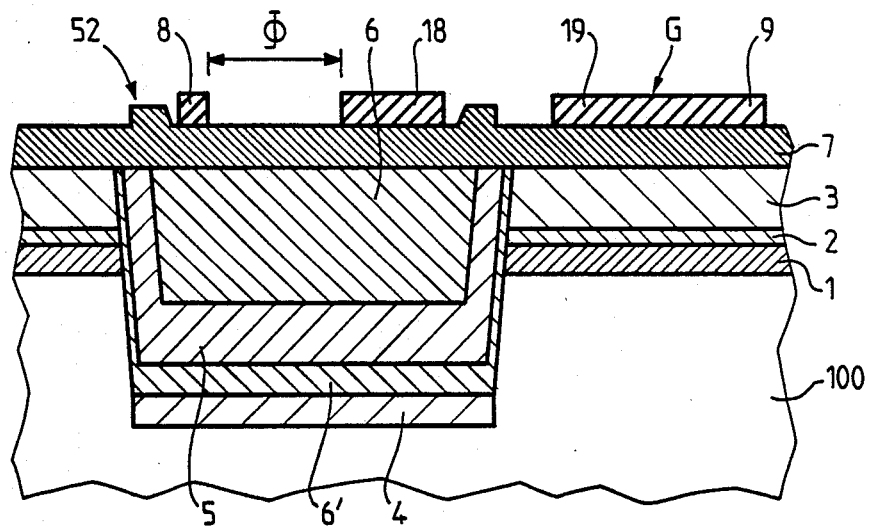

At the end of this growth, the mask MK1 is eliminated (cf. FIG. 1e in sectional view).

However, if an $n^{++}$ implanted region 4 has been formed on an edge of the pit, this region is protected, for example by a dielectric layer of silicon nitride ($Si_3N_4$) until the n-type contact metallization is formed.

(j) Forming at the surface of the whole device a layer 7 of the $p^+$ conductivity type. This layer is in this case obtained by diffusion of Zn atoms. This diffusion is effected in a half-opened ampulla at 530° C. by means of, for example, $ZnAs_2$ vapour for about 10 min. This $p^+$ type layer 7 is intended to form the p-type contacts of the pn junctions of the photodiode Δ and of the transistor T of the J-FET type. The diffusion thickness for forming the layer 7 is favourably $e_7 \approx 0.3$ μm to 0.7 μum in the material GaInAs (cf. FIG. 1f, which corresponds to the case of a diode having a single heterostructure). When the diode comprises a double hetero-structure and therefore an upper layer 5' of InP, the diffusion being effected more rapidly in InP, the p-type layer 7 will attain a depth of the order of 1 to 1.4 μm in the diode structure.

Figure 2A:
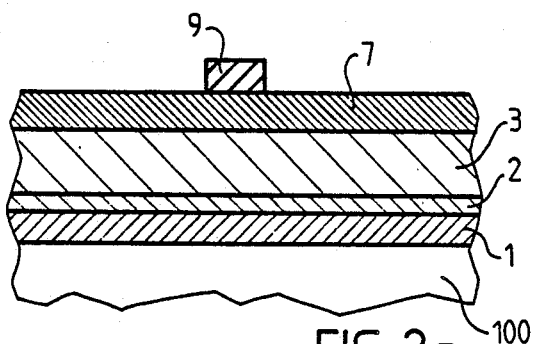
FIGS. 2a to 2c show in sectional view the steps of forming the transistor T of the J-FET type.

(k) Forming at the surface of the $p^+$ type layer 7 the p-type contact 8 of the photodiode Δ, which contact preferably will take the form of a ring (cf. FIG. 1g in a sectional view taken on the axis I—I of FIG. 5 viewed from above) provided with a surface 18 for the connection and the contact 9 of the gate G of the transistor of the J-FET type, which gate may be, for example:

of a width $l_g \approx 250$ μum,
of a length $L_G \approx 1$ μm and provided with a contact 19 for connection. The diameter of the ring 8 will favourably be $\phi \approx 80$ μm (cf. FIGS. 1g and 2a in sectional view and 5 viewed from above). The contact in the form of a ring limits the region of the diode Δ which receives the illumination.

The metallization for forming the layers 8, 18, 9, 19 will preferably be a multilayer of Ti/Pt/Au deposited in this order to succession with thicknesses of 50 nm for Ti, 70 nm for Pt and 150 nm for Au, respectively. This deposition is followed by an annealing of the order of 420° C. in a $H_2$ or $N_2$ atmosphere for about 2 min. The deposition takes place in the opening of a mask of, for example, photoresist, which is then eliminated.

Figure 1H:
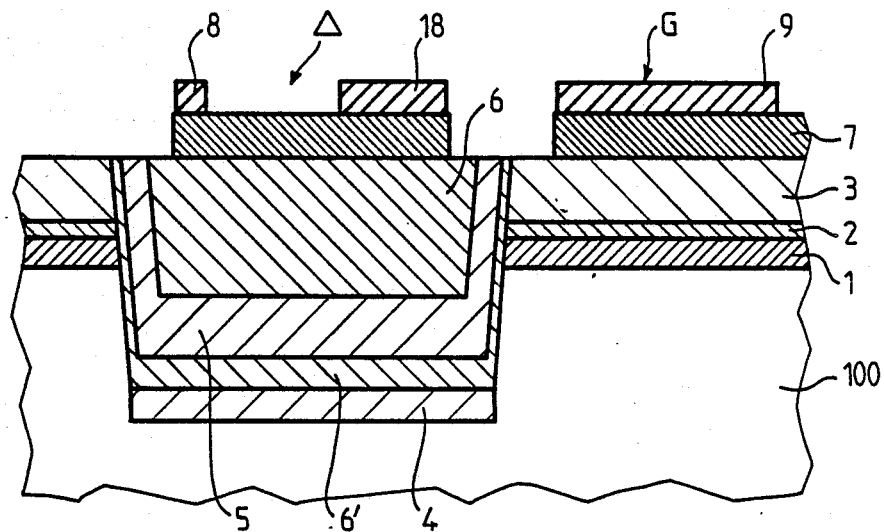
Figure 1I:
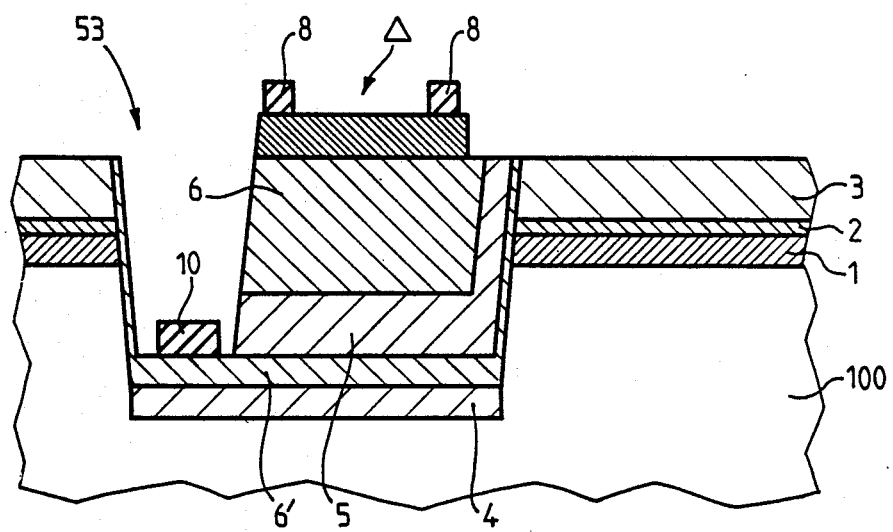
Figure 1J:
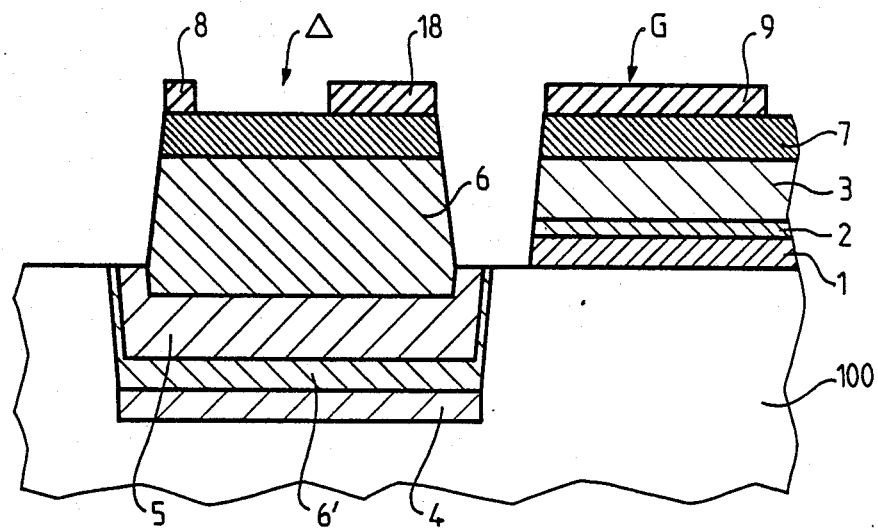
Figure 1K:
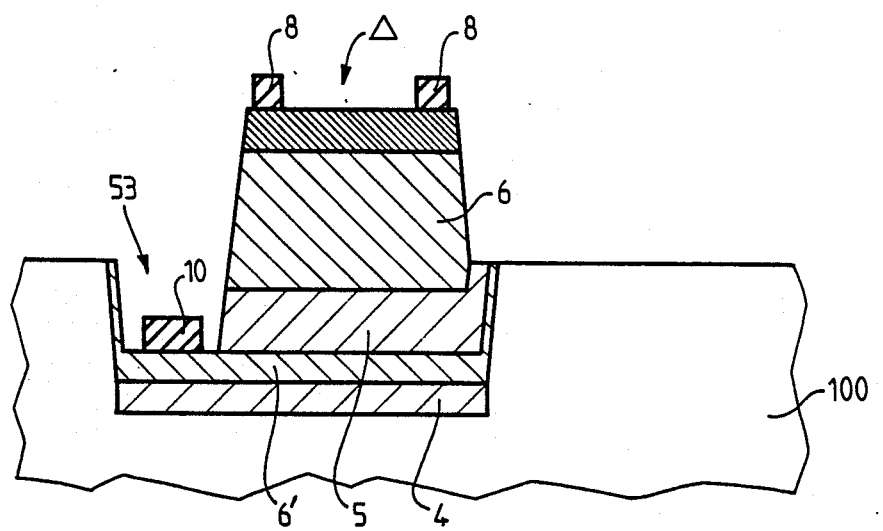
Figure 2B:
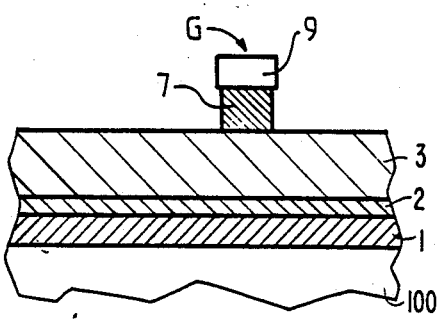
Figure 5:
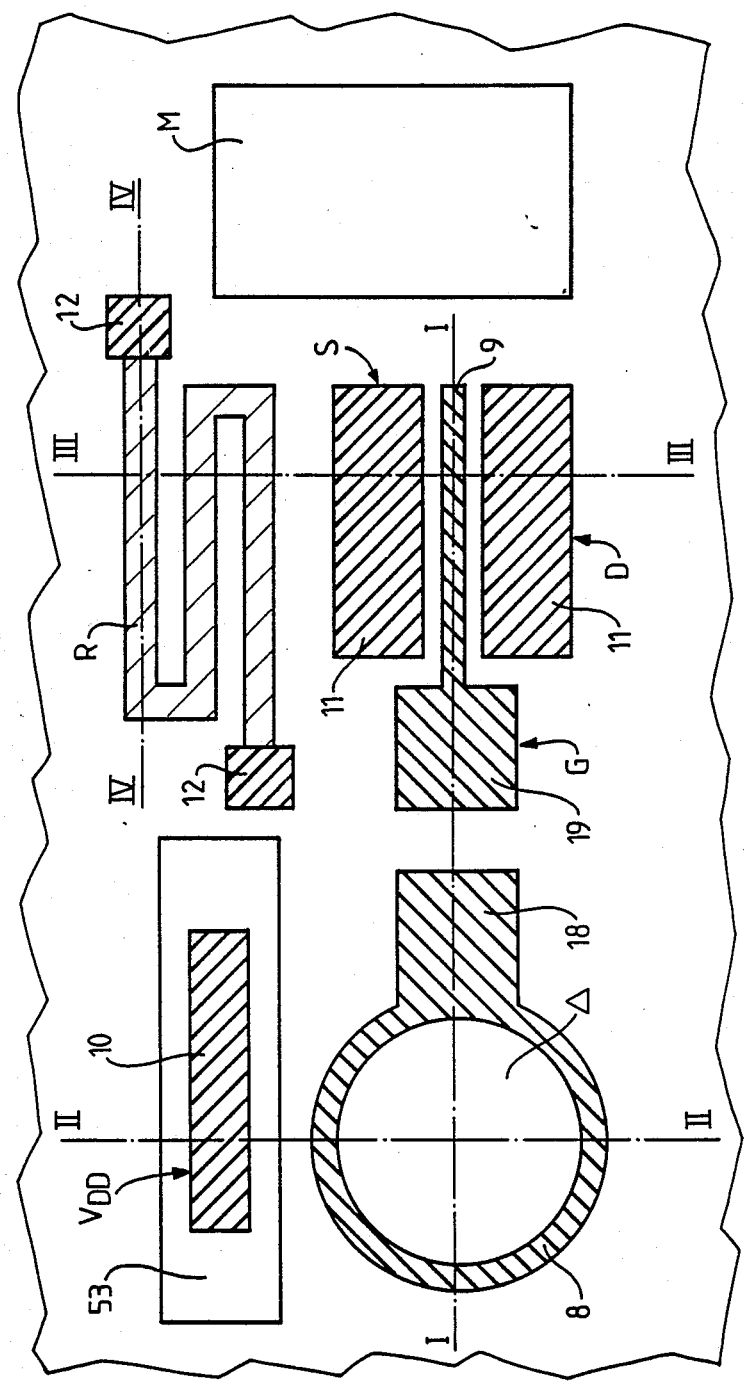
FIG. 5 is a top view of an example of arranging the photodetector according to the invention.

(l) Etching to eliminate the p-type layer 7 in all the regions of the device exlcusive of the region of the diode Δ and the gate G of the transistor (cf. FIG. 1h, which shows in sectional view taken on the axis I—I of FIG. 5 the diode Δ and the gate G of the transistor in an embodiment, and FIG. 2b showing in sectional view taken on the axis III—III of FIG. 5 the gate G of the transistor at the end of this step). This etching treatment is carried out using the ohmic contacts 9 and 19 as masks and a mask covering the assembly of the diode Δ by, for example, a chemical method. The etching treatment is stopped at the upper level of the layer 3 of GaInAs of $n^+$ type. A chemical mixture for carrying out this etching treatment may consist of citric acid + $H_2O_2$.

(m) Forming an opening in a region 53 situated along the outer edge of the ring 8, but inside the region 52 defined above of a pit, by means of a selective etching method, for example a chemical etching method, down to the upper level of the layer 6' of undoped GaInAs. Due to this etching treatment, the assembly of the circuit is protected during the manufacture by a mask. The layer 6 of GaInAs is etched in the first place, for example, by means of the mixture already mentioned of $4H_2SO_4 + 1H_2O_2 + 10H_2O$. Subsequently, the layer 5 of InP is etched, for example, by means of the mixture of $1HCl + 1H_3PO_4$. These chemical mixtures permitting of obtaining the steps of etching the materials GaInAs and InP selectively, the step of etching the pit 53 is stopped automatically at the upper surface of the layer of GaInAs 6', if the latter exists. This layer 6' plays the part of a stopper layer and therefore it is of major importance. The object is to expose the bottom of the pit 53 to establish an n-type ohmic contact with the layer 4 of $n^{++}$ type InP. The stopper layer 6' can be maintained; it does not adversely affect the establishment of this ohmic contact due to its small thickness (cf. FIG. 1i in sectional view taken on the axis II—II of FIG. 5).

In the case in which the layer 4 of the $n^{++}$ type has been formed on one of the flanks and one of the outer edges of the pit, the opening 53 is not formed and the n-type ohmic contact can be formed after elimination of the $Si_3N_4$ projection at the surface of the device in the reserved region.

Figure 2C:
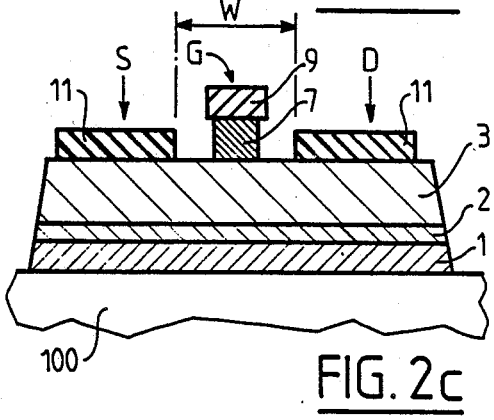
Figure 3A:
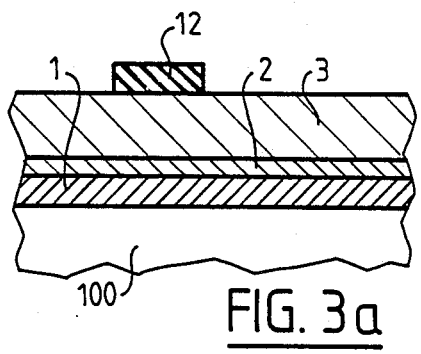
FIGS. 3a to 3c show in sectional view the steps of forming the load resistor of the transistor.
Figure 3B:
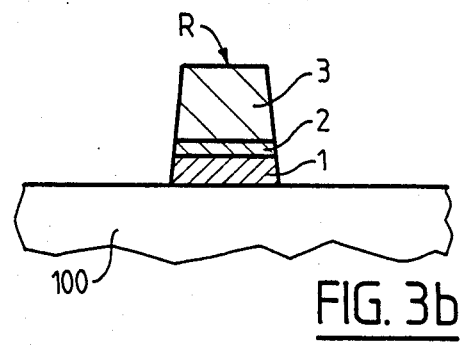
Figure 3C:
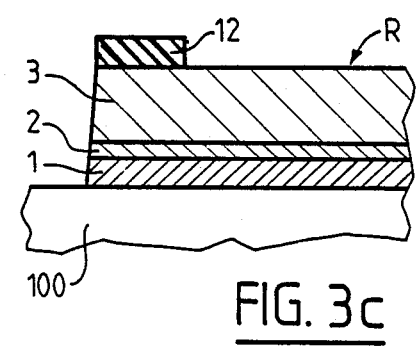

(n) Forming the ohmic contacts of the n-type in the openings of a mask, these openings providing the position of the connection contact 10 at the surface of the layer 4, as the case may be in the pit 53 (contact of the n-type of the diode Δ (cf. FIG. 1i)) or in the region reserved along the edge of the pit;

the position of the zones 11 on either side of the gate G of the transistor T to form the source and drain contacts S and D, respectively, of the transistor T at the surface of the layer 3 of n-type GaInAs (cf. FIG. 2c in sectional view taken on the axis III—III of FIG. 5);

the position of the zones 12 constituting the ends of the load resistor R of the transistor T also at the surface of the layer 3 of n-type GaInAs (cf. FIG. 3c in sectional view taken on the axis IV—IV of FIG. 5 viewed from above).

These n-type ohmic contacts are formed by a metallisation composed of an alloy of Au-Ge on which a layer of Ni is disposed. The mask is then eliminated. The alloy of the ohmic contact is obtained by heating the device to a temperature of about 410° C. in $H_2$ for about 1 min.

If the layers 7, 3, 2 constituting the structure of the transistor T have been formed with the largest thicknesses of the given ranges, the thickness of the gate contact 7 is sufficient to permit of carrying out a method of self-alignment. In fact, during the step of etching the layer 7 around the gate metallization 9 serving as a mask, a lateral so-called under-etching is obtained of the same order as the vertical etching. If the thickness of the gate contact 7 is sufficient, the source (S) and drain (D) metallizations 11 can be obtained by using the edges of the gate metallization 9 as a mask. The performances of a transistor whose electrodes are thus self-aligned are higher due to the fact that the gate length is reduced. Thus, gate lengths in the submicron range can be attained.

In the case in which the thicknesses of the layers of the structure of transistor are chosen to be small, the source and drain zones 11 are formed by a simple alignment and are spaced apart by a distance $W \approx 4$ μm.

(o) Etching around the diode Δ, around the transistor T and around the pattern provided for the resistor R in order of succession the layers 3, 2 and 1 to cause the surface of the substrate to appear. During this etching operation, the diode Δ, the transistor T and the resistor R are protected by a mask. This operation is intended to form MESA's to isolate the diode Δ and the transistor T and to define the resistive region constituting the resistor R. This etching step can be carried out chemically in the conditions described during the preceding steps. The mask is then eliminated.

The pattern of the resistor R is provided by a calculation, which gives the value of the resistor as a function of the length of this resistor, of the thickness and of the width of the resistive material (in this case n-type GaInAs) and of its resistivity, which is a function of the carrier concentration. Thus, according to the path defined, resistors of 50Ω to 100 kΩ can be obtained as a function of the desired circuit (cf. FIG. 1j in sectional view taken on the axis I—I, FIG. 1k in sectional view taken on the axis II—II for the diode Δ; cf. FIG. 2c in sectional view taken on the axis III—III for the transistor T; cf. FIG. 3b in sectional view taken on the axis III—III and FIG. 3c in sectional view taken on the axis IV—IV for the resistor).

Figure 6:
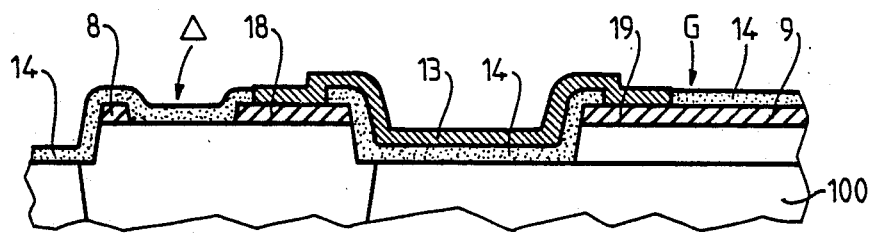
FIG. 6 shows in sectional view the interconnection of the gate of the transistor T and the p contact of the diode Δ.

(p) Forming a dielectric layer 14 favourably of silica (SiO$_2$) on the assembly of the device by providing openings in a zone M intended to constitute an earth contact,
the n-type contact region 10 of the diode,
the p-type contact region 18 of the diode,
the gate contact 19 of the transistor,
the source and drain regions 11 of the transistor,
the regions 12 of the two ends of the resistor R, as the case may be a zone for constituting a contact for the direct voltage supply V$_{DD}$, as the case may be a zone for constituting an output connection S of the signal available at the drain D (cf. FIG. 6 showing in sectional view the interconnection between the p-type contact of the diode and the gate of the transistor).

(g) Forming the interconnection metallizations 13 for connecting:

one end of the resistor R to the contact 19 of the transistor and to the contact 18 of the diode, the other end of the resistor R to the source and to earth M, the region of which is metallized by the same operation, the drain to the output connection the region of which is metallized by the same operation, the contact 10 of the diode to the contact for the supply V$_{DD}$, whose region is metallized by the same operation.

This interconnection metallization is formed in the openings of a mask which exposes on the one hand the same regions as the dielectric layer 14 and on the other hand the pattern of the interconnection lines. After the formation of these interconnections, this mask is eliminated by removing by means of "Lift-off" the metal deposited outside the contacts and the interconnection lines.

However, the dielectric layer 14 is maintained as protective layer. It serves at the same time as antireflex layer on the photosensitive zone of the diode.

The interconnection metallization 13 is preferably a multi-layer Ti/Pt/Au as already described.

The interconnection 13 between the contact 18 of the diode and the contact 19 of the gate of the transistor is illustrated in FIG. 6 in sectional view taken on the axis I—I.

The tables I and II regroup the characteristics of the layers and contacts of the device according to the invention.

For the applications in the field of infrared detection, the layer 6 may consist of different materials III-V having a composition Ga$_x$In$_{1-x}$As$_y$P$_{1-y}$, in which x and y are the concentrations.

This composition is chosen in known manner as a function of the operating wavelength of the device, whilst aiming at conformity of lattice between these materials and InP.

TABLE I

| Ref. | Method of manufacturing | Composition | Conductivity type | Doping concentration | Dopants | Thickness in μm |
|---|---|---|---|---|---|---|
| 100 | Substrate | InP | S.I | | Cr (ion) | |
| 1 | Epitaxy | InP | n | ≈10$^{14}$ cm$^{-3}$ | N.I | e$_1$ ≦ 0,2 |
| 2 | Epitaxy | GaInAs | n | ≈2.10$^{15}$ cm$^{-3}$ | N.I | 0,5 ≦ e$_2$ ≦ 0,6 |
| 3 | Implantation | GaInAs | n$^+$ | ≈10$^{17}$ cm$^{-3}$ | Si$^{28}$ (ion) | 0,4 ≦ e$_3$ ≦ 0,5 |
| 4 | Implantation | InP | n$^{++}$ | >10$^{17}$ cm$^{-3}$ | Si$^{28}$ (ion) | e$_4$ ≈ 0,6 |
| 6' | Epitaxy | GaInAs | n | ≈2.10$^{15}$ cm$^{-3}$ | N.I | e$_6$' ≈ 0,1 |
| 5 | " | InP | n | ≈10$^{14}$ cm$^{-3}$ | N.I | e$_5$ ≈ 2 |
| 5' | " | " | n | " | N.I | e$_5$' ≈ 1 |
| 6 | " | GaInAs | n | ≈2.10$^{15}$ cm$^{-3}$ | N.I | 2 ≦ e$_6$ ≦ 3,5 |
| 7 | Diffusion | GaInAs | p$^+$ | | Zn (atom) | 0,3 ≦ e$_7$ ≦ 0,7 |

Abbreviations:
Ref. = Reference of the layer or element
S.I. = Semi-isolating
N.I. = Not intentional

TABLE II

| Ref. | Composition | Type of contact |
|---|---|---|
| 8, 18, 9 19 | Ti/Pt/Au | Ohmic type p |
| 10, 11, 12 | Au—Ge/Ni | Ohmic type n |
| 13, M | Ti/Pt/Au | Interconnections |

What is claimed is:

1. A method of manufacturing an integrated circuit for detecting infrared radiation comprising a semi-isolating substrate provided with a buried PIN photodiode, with a junction field effect transistor J-FET, whose gate is connected to the PIN photodiode, and with a resistor R connected to the transistor, this method including the stop of growing a first structure of epitaxial layers of semiconductor materials, in which a transistor of the J-FET type is formed, the step of growing a second structure of epitaxial layers of semiconductor materials, in which the PIN diode is formed, and the step of etching a pit, in which the second structure of layers is formed, characterized in that the step of etching the pit is carried out after the growth of the first structure of epitaxial layers and is effected through this structure into the substrate, in that the growth of the second structure of epitaxial layers is localized in such a manner that this second structure is limited to the pit, and in that its upper surface is coplanar with that of the first structure of layers, the epitaxial growth of the layers of the first structure and of the layers of the second structure being effected without doping other than the residual growth doping, and in that the regions of the n- and the p-conductivity type of the transistor and of the diode are obtained by a method chosen among implantation and diffusion of species suitable for obtaining the n- and the p-conductivity type, respectively.

2. A method as claimed in claim 1, characterized in that, in order to obtain a contact layer of the $n^{++}$ type for the PIN diode, an ion implantation of a type suitable for obtaining the n-conductivity type is effected in a localized manner on the bottom of the pit in the material of the substrate before the growth of the second structure of epitaxial layers, and in that the annealing of this implantation is effected in the chamber of the reactor used for the epitaxial growth of this second structure of layers in a controlled atmosphere.

3. A method as claimed in claim 2, characterized in that this localized implantation also extends on one of the flanks of the pit and on a zone adjoining the pit.

4. A method as claimed in claim 2, characterized in that, in order to form the active layer of the transistor of the J-FET type and the resistor R, the formation of the first structure of epitaxial layers comprises the growth on a substrate of semi-isolating InP of an epitaxial layer having a composition $Ga_xIn_{1-x}As_yP_{1-y}$, in which x and y are the concentrations, and being not intentionally doped during the growth, while this layer is subjected after the growing step to an ion implantation of a type suitable for obtaining the n-conductivity type over a depth smaller than its thickness, which implantation is followed by an annealing treatment in the chamber of the epitaxy reactor in a controlled atmosphere.

5. A method as claimed in claim 4, characterized in that the formation of the first structure of layers comprises the growth between the substrate and the layer of $Ga_xIn_{1-x}As_yP_{1-y}$ of an epitaxial layer of InP to form a buffer layer.

6. A method as claimed in claim 4, characterized in that the formation of the second structure of epitaxial layers comprises the formation of a hetero-structure of III-V materials, these layers also being localized in the pit, the growth of a said first layer of InP followed by the growth of a layer having a composition $Ga_xIn_{1-x}As_yP_{1-y}$, in which x and y are the concentrations, these layers being not intentionally doped and forming the n-type region of the PIN diode.

7. A method as claimed in claim 6, characterized in that the formation of the second structure of epitaxial layers comprises the growth localized in the pit before the growth of the first layer of InP, of a layer of $Ga_xIn_{1-x}As_yP_{1-y}$ not intentionally doped and forming a buffer layer and as the case may be an etching stopper layer.

8. A method as claimed in any one of claim 6, characterized in that, in order to form the p-type region of the PIN diode and the gate of the transistor of the J-FET type, a diffusion of a type suitable for obtaining the p-conductivity type is effected in a nonlocalized manner in the upper part of the first structure of layers and of the second structure of layers, inclusive, however, of the $n^{++}$ type region if the latter appears at the surface over a depth smaller than the thickness of the layer formed by implantation of the first structure and larger than or equal to the thickness of the second epitaxial layer of InP of the second structure if this layer exists.

9. A method as claimed in claim 8, characterized in that, in order to form the p-type contact of the PIN diode and the gate electrode of the transistor the J-FET type, p-type ohmic metallizations are formed at the p-type upper surface in the regions of the second and of the first structure of layers, respectively.

10. A method as claimed in claim 9, characterized in that the p-type contact of the diode is formed as a ring provided with a connection and the gate electrode of the transistor is formed as a finger provided with a connection.

11. A method as claimed in claim 10, characterized in that the diffused p-type layer is eliminated from the device by etching around the p-type ohmic contacts serving as masks and exlusive of the central region of the ring, which is maintained by means of a protective layer during the etching treatment.

12. A method as claimed in claim 11, characterized in that the step of etching the p-type layer is carried out so as to obtain under the p-type ohmic contact metallizations serving as masks a lateral so-called under-etching.

13. A method as claimed in claim 12, characterized in that, when the $n^{++}$ layers does not appear at the surface, an etching step is carried out in the layers of the second structure outside the p-type region in order to expose a zone of the $n^{++}$ type contact layer, this etching step being stopped, as the case may be, by the etching stopper layer when the latter exists.

14. A method as claimed in claim 13, characterized in that, in order to form the n-type contact of the PIN diode, the source and drain electrodes of the transistor and the ends of the resistor R, n-type ohmic metallizations are formed at the surface of the n-type layer of the first structure of layers and at the surface of the $n^{++}$ layer of the second structure.

15. A method as claimed in claim 14, characterized in that the lateral edges of the p-type metallization of the gate electrode serve as masks to form the n-type source and drain metallizations of the transistor by means of a so-called self-alignment method utilizing the under-etchings to avoid the shortcircuits between electrodes.

16. A method as claimed in claim 15, characterized in that at the end of the formation of the n-type metallizations, the layers are etched around the elements down to the upper surface of the substrate to form isolation MESA's around the diode and the transistor and to define the surface of the resistor R between its end metallizations.

17. A method as claimed in claim 16, characterized in that at the end of this etching step it comprises the deposition of a dielectric layer on the surface of the device inclusive of the surface of the inner region of the p-type contact in the form of a ring of the diode, designated as illumination region, and exclusive of the electrical contact connections of the diode, the transistor, the ends of the resistor R and the zones provided on the substrate to form earth and D.C. supply contacts so as to form a protective layer for the device and an antireflex layer for the illumination region.

18. A method as claimed in claim 17, characterized in that it moreover comprises a step of forming at the surface of the dielectric protective layer metallization strips to connect one end connection of the resistor R to the gate contact of the transistor and to the p-type contact connection of the diode, to connect the connection of the second end of the resistor R to the source S of the transistor and to an earth connection M and to connect the n-type contact of the diode to a contact for the D.C. supply $V_{DD}$.

19. A method as claimed in claim 4, characterized in that the formation of the second structure of epitaxial layers comprises the formation of a double hetero-structure of III-V materials, these layers also being localized in the pit, the growth of a said first layer of InP followed by the growth of a layer of $Ga_xIn_{1-x}As_yP_{1-y}$, in which x and y are the concentrations, then the growth of a said second layer of InP, these layers being not intentionally doped and forming the n-type region of the PIN diode.

20. A method as claimed in claim 4, characterized in that the concentrations of the compound $Ga_xIn_{1-x}As_yP_{1-y}$ are:
$x = 0.47$
$y = 1$.

21. A method as claimed in claim 4 characterized in that, to obtain the semi-isolating substrate, the InP material is doped with Cr, to obtain the layer (3) of the $n^+$ type $Si^{28}$ ions are implanted into the layer of GaInAs at a concentration of the order of $10^{17}.cm^{-3}$, to obtain the $n^{++}$ type layer $Si^{28}$ ions are implanted into the material InP of the bottom of the pit at a concentration of the order of $10^{17}.cm^{-3}$, and to obtain the upper layer of the $p^+$ type Zn atoms are diffused into the GaInAs layer.

22. A method as claimed in claim 21, characterized in that the diffusion of Zn atoms is effected in a half-opened ampulla at 530° C. by means of vapours of $ZnAs_2$ for about 10 min.

23. A method as claimed in claim 21, characterized in that the implantation annealing of the ions for obtaining the n-type layer of the first structure is effected at about 700° C. for about 15 min at a partial arsine ($AsH_3$) pressure and the ion implantation annealing in the pit to obtain the $n^{++}$ layer is effected at about 700° C. for about 1 hour at a partial phosphine ($PH_3$) and arsenic ($As_2$) pressure in the epitaxy reactor.

24. A method as claimed in claim 4, characterized in that the p-type ohmic contacts are formed from a multi-layer Ti/Pt/Au, the n-type ohmic contacts are formed from the compound Au-Ge covered by a layer of Ni and annealed to form the alloy and the interconnections between elements and the earth connection M are formed from a multi-layer Ti/Pt/Au.

25. A method as claimed in claim 1, characterized in that the epitaxial layers are formed by chloride apitaxy from the vapour phase with their residual doping concentration (VPE).

26. A method as claimed in claim 1, characterized in that to the extent of which these layers exist, their thicknesses are given (in $\mu m$) by
(a) in the first structure
thickness of the buffer layer $e_1 \leq 0.2$
thickness of the epitaxial GaInAs layer $0.5 \leq e_2 \leq 1$ $\mu m$,
depth of the n-type implantation in the epitaxial layer of GaInAs $0.4 \leq e_3 \leq 0.9$,
depth of the p-type diffusion in the layer of GaInAs $0.3 \leq e_7 \leq 0.7$,
(b) in the second structure
$n^{++}$ type implantation in the pit $e_4 \approx 0.6$,
thickness of the buffer and stopper layer $e_6 \approx 0.1$ of the first layer of InP $e_5 \approx 2$
of the layer 2 of GaInAs $\leq e_6 \leq 3.5$,
of the second layer of InP $e_5 \approx 1$
and the depth of the pit for receiving the second structure is $5 \mu m \leq e_{51} \leq 5.5 \mu m$.

* * * * *